United States Patent
Mei et al.

(10) Patent No.: US 12,527,158 B2
(45) Date of Patent: *Jan. 13, 2026

(54) QUANTUM DOT LIGHT EMITTING DEVICE COMPRISING THREE SUB-FUNCTION LAYERS WITH DIFFERENT SURFACE ENERGY OF LIGANDS, PREPARATION METHOD THEREOF AND DISPLAY APPARATUS

(71) Applicant: BOE Technology Group Co., Ltd., Beijing (CN)

(72) Inventors: Wenhai Mei, Beijing (CN); Yichi Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1184 days.

This patent is subject to a terminal disclaimer.

(21) Appl. No.: 17/405,963

(22) Filed: Aug. 18, 2021

(65) Prior Publication Data
US 2022/0098479 A1    Mar. 31, 2022

(30) Foreign Application Priority Data
Sep. 28, 2020    (CN) .......................... 202011037916.6

(51) Int. Cl.
*H10K 50/16*      (2023.01)
*H10K 50/115*     (2023.01)
(Continued)

(52) U.S. Cl.
CPC .......... *H10K 50/166* (2023.02); *H10K 50/11* (2023.02); *H10K 50/115* (2023.02); *H10K 50/15* (2023.02); *H10K 50/16* (2023.02); *H10K 2101/40* (2023.02)

(58) Field of Classification Search
None
See application file for complete search history.

(56) References Cited

U.S. PATENT DOCUMENTS

| 2017/0309861 A1 | 10/2017 | Wang et al. |
| 2019/0006607 A1 | 1/2019  | Yang et al. |

(Continued)

FOREIGN PATENT DOCUMENTS

| CN | 103762318 A | 4/2014 |
| CN | 104518106 A | 4/2015 |

(Continued)

OTHER PUBLICATIONS

CN202011037916.6 first office action.
(Continued)

*Primary Examiner* — Daniel Whalen
(74) *Attorney, Agent, or Firm* — IPro, PLLC

(57) ABSTRACT

Disclosed are a quantum dot light emitting device, a preparation method thereof and a display apparatus. In embodiments of the present disclosure, at least one of one or more light emitting function layers is disposed to include at least two sub-function layers, each sub-function layer includes ligands, and surface energy of the ligands corresponding to the sub-function layers gradiently changes in a transmission direction of carriers in the sub-function layers, so that energy levels of the sub-function layers gradiently change. In this way, the energy levels of the sub-function layers can be matched with energy levels of the adjacent light emitting function layers.

12 Claims, 8 Drawing Sheets

(51) Int. Cl.
  *H10K 50/11* (2023.01)
  *H10K 50/15* (2023.01)
  *H10K 101/40* (2023.01)

(56) References Cited

U.S. PATENT DOCUMENTS

| | | | |
|---|---|---|---|
| 2019/0051849 A1 | 2/2019 | Zhou et al. | |
| 2019/0157595 A1 | 5/2019 | Seo et al. | |
| 2019/0198793 A1 | 6/2019 | Guo | |
| 2019/0326539 A1* | 10/2019 | Chung | H10K 59/12 |
| 2021/0043864 A1 | 2/2021 | Li | |
| 2022/0416186 A1* | 12/2022 | Takenaka | H10K 50/115 |
| 2023/0337447 A1* | 10/2023 | Mei | H10K 50/166 |

FOREIGN PATENT DOCUMENTS

| | | |
|---|---|---|
| CN | 104868026 A | 8/2015 |
| CN | 105161635 A | 12/2015 |
| CN | 105576139 A | 5/2016 |
| CN | 107342367 A | 11/2017 |
| CN | 107611272 A | 1/2018 |
| CN | 107665949 A | 2/2018 |
| CN | 108878491 A | 11/2018 |
| CN | 109728179 A | 5/2019 |
| CN | 109817772 A | 5/2019 |
| CN | 110289360 A | 9/2019 |
| CN | 112151689 A | 12/2020 |
| EP | 3544074 A2 | 9/2019 |

OTHER PUBLICATIONS

U.S. Appl. No. 17/787,995 non-final office action dated Feb. 20, 2025.
CN202110573085.2 first office action Mar. 5, 2025.

* cited by examiner

QUANTUM DOT LIGHT EMITTING DEVICE COMPRISING THREE SUB-FUNCTION LAYERS WITH DIFFERENT SURFACE ENERGY OF LIGANDS, PREPARATION METHOD THEREOF AND DISPLAY APPARATUS

CROSS-REFERENCE TO RELATED APPLICATION

This application is based on and claims priority under 35 U.S.C 119 to Chinese Patent Application No. 202011037916.6, filed on Sep. 28, 2020, in the China National Intellectual Property Administration. The entire disclosure of the above application is incorporated herein by reference.

FIELD

The present disclosure relates to the technical field of display, in particular to a quantum dot light emitting device, a preparation method thereof and a display apparatus.

BACKGROUND

Quantum dot light emitting diodes (QLED) have the advantages of high luminous intensity, good monochromaticity, high color saturation, good stability and the like, thereby having good application prospects in the field of display.

SUMMARY

Accordingly, an embodiment of the present disclosure provides a quantum dot light emitting device, including an anode, one or more light emitting function layers and a cathode which are disposed in a stacked mode, wherein at least one of the one or more light emitting function layers includes at least two sub-function layers, each of the sub-function layers includes ligands, and surface energy of the ligands corresponding to the sub-function layers gradiently changes in a transmission direction of carriers in the sub-function layers, so that energy levels of the sub-function layers gradiently change.

Optionally, during specific implementation, in the above quantum dot light emitting device provided by an embodiment of the present disclosure, at least one of the one or more light emitting function layers includes three sub-function layers.

Optionally, during specific implementation, in the above quantum dot light emitting device provided by an embodiment of the present disclosure, the ligands include:
fluorine-containing group ligands with low surface energy as well as hydrophobic amine ligands and hydrophilic amine ligands with high surface energy; wherein in response to the light emitting function layers being manufactured on a hydrophilic film layer, the surface energy of the hydrophilic amine ligands is greater than that of the hydrophobic amine ligands; and
in response to the light emitting function layers being manufactured on a hydrophobic film layer, the surface energy of the hydrophobic amine ligands is greater than that of the hydrophilic amine ligands.

Optionally, during specific implementation, in the above quantum dot light emitting device provided by an embodiment of the present disclosure, the hydrophilic amine ligands include alcohol amine ligands, and the hydrophobic amine ligands include alkane amine ligands.

Optionally, during specific implementation, in the above quantum dot light emitting device provided by an embodiment of the present disclosure, the light emitting function layers include an electron transfer layer, a quantum dot light emitting layer and a hole transfer layer, the electron transfer layer is close to the cathode, and the hole transfer layer is close to the anode; wherein at least one of the electron transfer layer, the quantum dot light emitting layer and the hole transfer layer includes three sub-function layers.

Optionally, during specific implementation, in the above quantum dot light emitting device provided by an embodiment of the present disclosure, the electron transfer layer includes a first sub-function layer, a second sub-function layer and a third sub-function layer which are disposed in a stacked mode, the first sub-function layer is close to the quantum dot light emitting layer, and the third sub-function layer is close to the cathode; and LUMO energy levels of the first sub-function layer, the second sub-function layer and the third sub-function layer are gradually deepened, and surface energy of the first sub-function layer, the second sub-function layer and the third sub-function layer is gradually decreased or gradually increased.

Optionally, during specific implementation, in the above quantum dot light emitting device provided by an embodiment of the present disclosure, in response to the electron transfer layer being manufactured on a hydrophobic film layer, a material of the first sub-function layer is magnesium zinc oxide nanoparticles with hydrophobic amine as ligands, and molar mass of magnesium is 0% to 50% that of magnesium zinc oxide; a material of the second sub-function layer is magnesium zinc oxide nanoparticles with hydrophilic amine as ligands, and molar mass of magnesium is 0% to 50% that of magnesium zinc oxide; and a material of the third sub-function layer is zinc oxide nanoparticles with fluorine-containing groups as ligands, and content of the magnesium in the first sub-function layer is greater than content of the magnesium in the second sub-function layer; and in response to the electron transfer layer being manufactured on a hydrophilic film layer, a material of the first sub-function layer is magnesium zinc oxide nanoparticles with fluorine-containing groups as ligands, and molar mass of magnesium is 0% to 50% that of magnesium zinc oxide; a material of the second sub-function layer is magnesium zinc oxide nanoparticles with hydrophobic amine as ligands, and molar mass of magnesium is 0% to 50% that of magnesium zinc oxide; and a material of the third sub-function layer is zinc oxide nanoparticles with hydrophilic amine as ligands, and content of the magnesium in the first sub-function layer is greater than content of the magnesium in the second sub-function layer.

Optionally, during specific implementation, in the above quantum dot light emitting device provided by an embodiment of the present disclosure, the quantum dot light emitting layer includes a fourth sub-function layer, a fifth sub-function layer and a sixth sub-function layer which are disposed in a stacked mode, the fourth sub-function layer is close to the hole transfer layer, and the sixth sub-function layer is close to the electron transfer layer; and HOMO energy levels of the fourth sub-function layer, the fifth sub-function layer and the sixth sub-function layer are gradually deepened, and surface energy of the fourth sub-function layer, the fifth sub-function layer and the sixth sub-function layer is gradually decreased or gradually increased.

Optionally, during specific implementation, in the above quantum dot light emitting device provided by an embodiment of the present disclosure, ligands of the fourth sub-function layer have triphenylamine or carbazole ligands, ligands of the fifth sub-function layer have alkane ligands, and ligands of the sixth sub-function layer have pyridine ligands;

in response to the quantum dot light emitting layer being manufactured on a hydrophobic film layer, the ligands of the fourth sub-function layer further have hydrophobic amine ligands, the ligands of the fifth sub-function layer further have hydrophilic amine ligand, and the ligands of the sixth sub-function layer further have fluorine-containing group ligands; and in response to the quantum dot light emitting layer being manufactured on a hydrophilic film layer, the ligands of the fourth sub-function layer further have fluorine-containing group ligands, the ligands of the fifth sub-function layer further have hydrophobic amine ligand, and the ligands of the sixth sub-function layer further have hydrophilic amine ligands.

Optionally, during specific implementation, in the above quantum dot light emitting device provided by an embodiment of the present disclosure, the quantum dot light emitting layer includes a fourth sub-function layer, a fifth sub-function layer and a sixth sub-function layer which are disposed in a stacked mode, the fourth sub-function layer is close to the hole transfer layer, and the sixth sub-function layer is close to the electron transfer layer; and HOMO energy levels of the fourth sub-function layer, the fifth sub-function layer and the sixth sub-function layer are gradually deepened, and surface energy of the fourth sub-function layer, the fifth sub-function layer and the sixth sub-function layer is gradually decreased or gradually increased.

Optionally, during specific implementation, in the above quantum dot light emitting device provided by an embodiment of the present disclosure, when the quantum dot light emitting layer is manufactured on a hydrophobic film layer, ligands of the fourth sub-function layer have hydrophobic amine ligands, ligands of the fifth sub-function layer further have hydrophilic amine ligand, and ligands of the sixth sub-function layer have fluorine-containing group ligands; and in response to the quantum dot light emitting layer being manufactured on a hydrophilic film layer, the ligands of the fourth sub-function layer have fluorine-containing group ligands, the ligands of the fifth sub-function layer further have hydrophobic amine ligand, and the ligands of the sixth sub-function layer have hydrophilic amine ligands.

Optionally, during specific implementation, in the above quantum dot light emitting device provided by an embodiment of the present disclosure, the hole transfer layer includes a seventh sub-function layer, an eighth sub-function layer and a ninth sub-function layer which are disposed in a stacked mode, the seventh sub-function layer is close to the anode, and the ninth sub-function layer is close to the quantum dot light emitting layer; and HOMO energy levels of the seventh sub-function layer, the eighth sub-function layer and the ninth sub-function layer are gradually deepened, and surface energy of the seventh sub-function layer, the eighth sub-function layer and the ninth sub-function layer is gradually decreased or gradually increased.

Optionally, during specific implementation, in the above quantum dot light emitting device provided by an embodiment of the present disclosure, in response to the hole transfer layer being manufactured on a hydrophilic film layer, a material of the seventh sub-function layer is nickel oxide nanoparticles with hydrophilic amine as ligands; a material of the eighth sub-function layer is nickel cesium oxide nanoparticles with hydrophobic amine as ligands, and molar mass of cesium is 0% to 50% that of nickel cesium oxide; and a material of the ninth sub-function layer is nickel cesium oxide nanoparticles with fluorine-containing groups as ligands, molar mass of cesium is 0% to 50% that of nickel cesium oxide, and content of the cesium in the ninth sub-function layer is greater than content of the cesium in the eighth sub-function layer; and in response to the hole transfer layer being manufactured on a hydrophobic film layer, a material of the seventh sub-function layer is nickel oxide nanoparticles with fluorine-containing groups as ligands; a material of the eighth sub-function layer is nickel cesium oxide nanoparticles with hydrophilic amine as ligands, and molar mass of cesium is 0% to 50% that of nickel cesium oxide; and a material of the ninth sub-function layer is nickel cesium oxide nanoparticles with hydrophobic amine as ligands, molar mass of cesium is 0% to 50% that of nickel cesium oxide, and content of the cesium in the ninth sub-function layer is greater than content of the cesium in the eighth sub-function layer.

Correspondingly, an embodiment of the present disclosure further provides a display apparatus, including the quantum dot light emitting device provided by some embodiments of the present disclosure.

Correspondingly, an embodiment of the present disclosure further provides a preparation method of a quantum dot light emitting device, including:

forming an anode, one or more light emitting function layers and a cathode which are disposed in a stacked mode; wherein at least one of the one or more light emitting function layers is formed through a one-time spin-coating process and includes at least two sub-function layers, each of the sub-function layers includes ligands, and surface energy of the ligands corresponding to the sub-function layers gradiently changes in a transmission direction of carriers in the sub-function layers, so that energy levels of the sub-function layers gradiently change.

Optionally, during specific implementation, in the above preparation method provided by an embodiment of the present disclosure, forming the light emitting function layers, specifically includes:

respectively preparing three function layer materials with surface energy and energy levels of the ligands gradiently changing;

mixing the three function layer materials to form a mixed solution; and spin-coating the mixed solution by adopting a spin-coating method to form the light emitting function layers.

Optionally, during specific implementation, in the above preparation method provided by an embodiment of the present disclosure, in response to a hydrophilic film layer being spin-coated with the mixed solution, surface energy of hydrophilic amine ligands is greater than that of hydrophobic amine ligands; and in response to a hydrophobic film layer being spin-coated with the mixed solution, the surface energy of the hydrophobic amine ligands is greater than that of the hydrophilic amine ligands.

DETAILED DESCRIPTION OF THE EMBODIMENTS

In order to make the objects, technical solutions and advantages of the present disclosure clearer, the present disclosure will be further described in detail in combination with the accompanying drawings below. Apparently, the described embodiments are only part of the embodiments of the present disclosure, not all of them. Based on the embodiments of the present disclosure, all other embodiments obtained by those of ordinary skill in the art without creative work shall fall within the protection scope of the present disclosure.

The shape and size of members in the accompanying drawings do not reflect true scales, and are only intended to schematically illustrate the content of the present disclosure.

The detailed description of a quantum dot light emitting device, a preparation method thereof and a display apparatus provided by embodiments of the present disclosure is illustrated in detail below in conjunction with the accompanying drawings.

Figure 1:
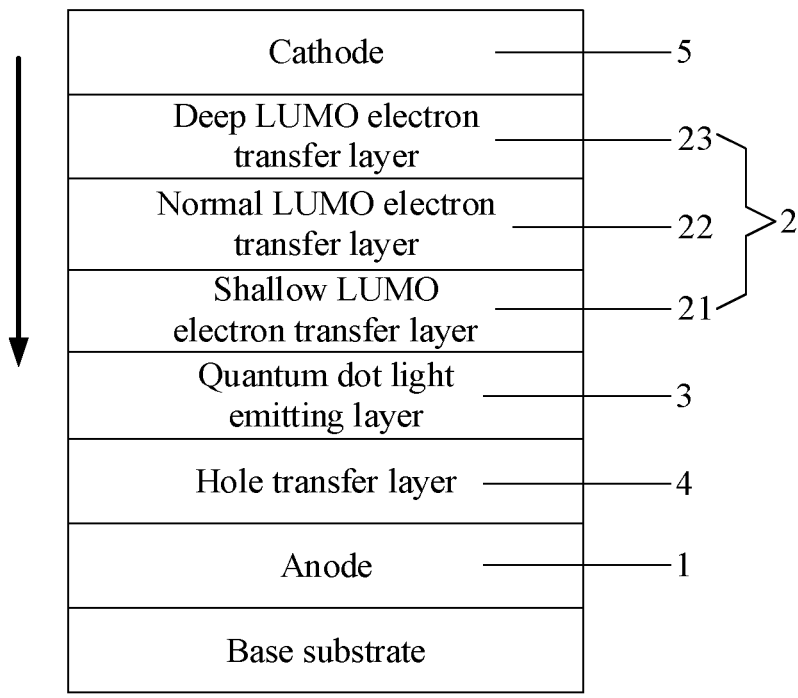
FIG. 1 is a schematic structural diagrams of a quantum dot light emitting device provided by an embodiment of the present disclosure.
Figure 2:
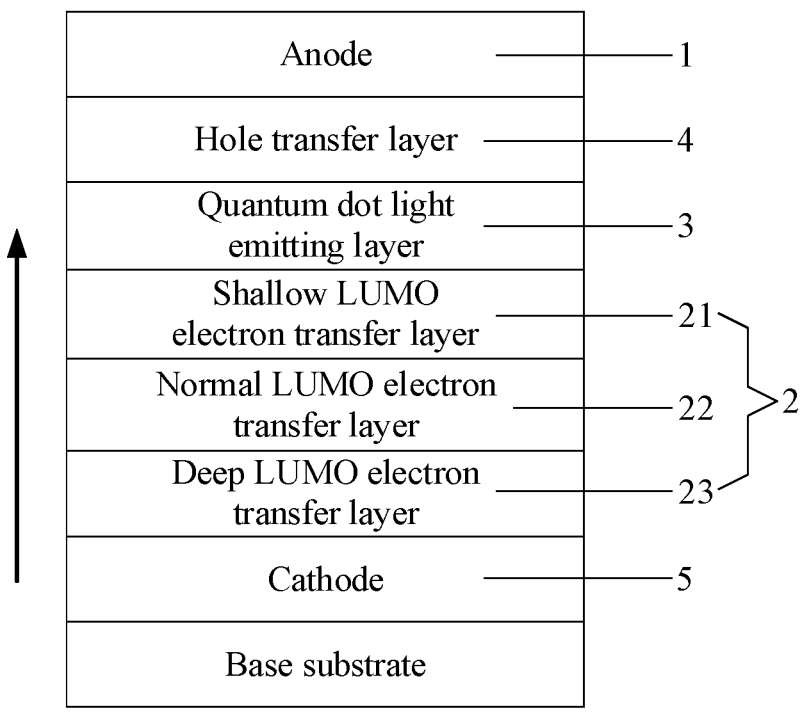
FIG. 2 is a schematic structural diagrams of another quantum dot light emitting device provided by an embodiment of the present disclosure.
Figure 3:
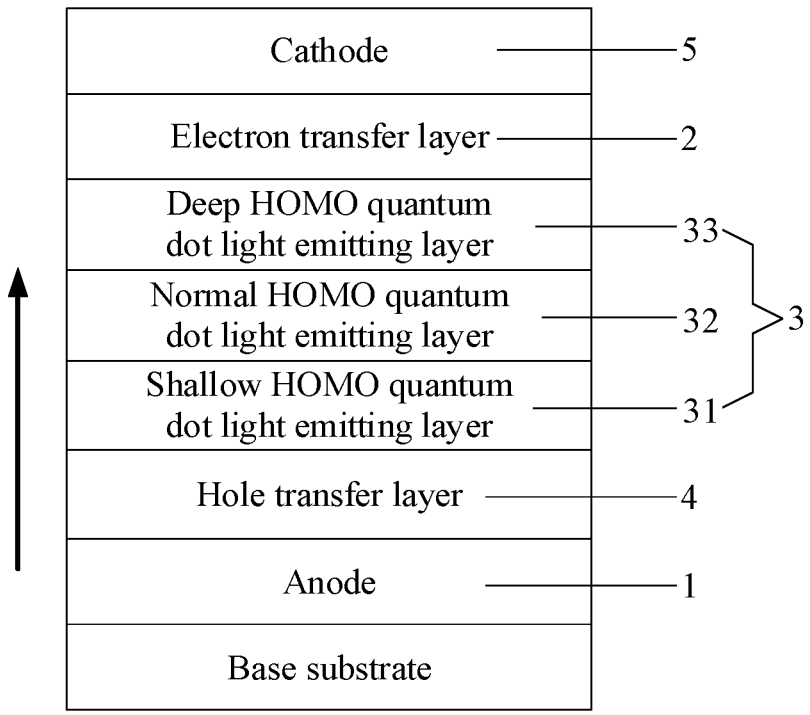
FIG. 3 is a schematic structural diagrams of another quantum dot light emitting device provided by an embodiment of the present disclosure.
Figure 4:
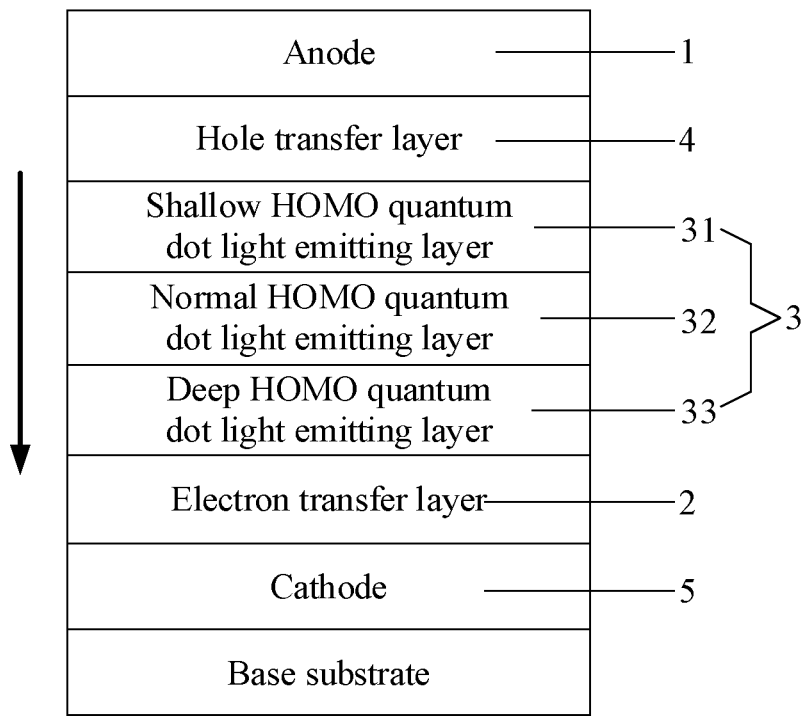
FIG. 4 is a schematic structural diagrams of another quantum dot light emitting device provided by an embodiment of the present disclosure.
Figure 5:
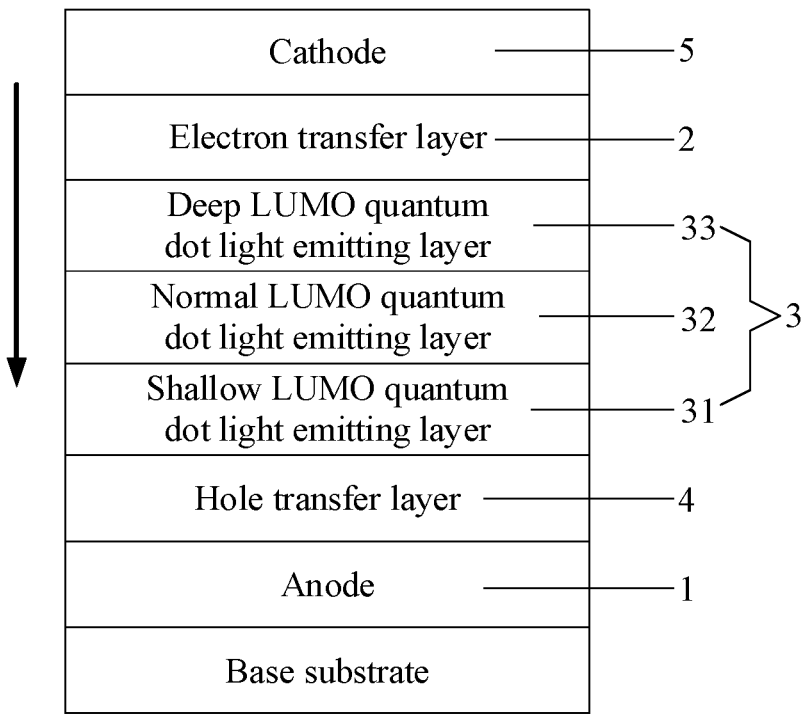
FIG. 5 is a schematic structural diagrams of another quantum dot light emitting device provided by an embodiment of the present disclosure.
Figure 6:
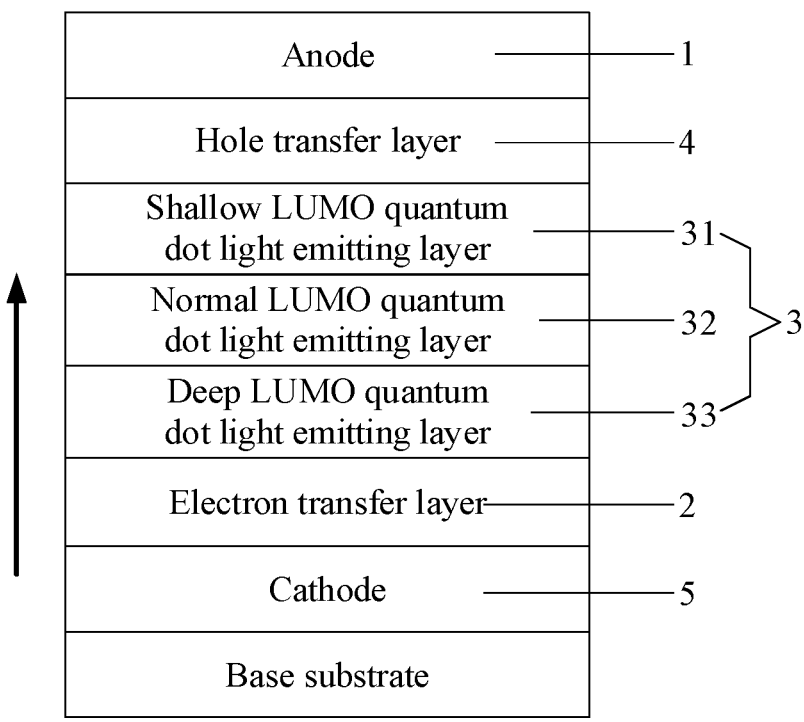
FIG. 6 is a schematic structural diagrams of another quantum dot light emitting device provided by an embodiment of the present disclosure.

A quantum dot light emitting device provided by an embodiment of the present disclosure, as shown in FIGS. 1-6, includes an anode 1, one or more light emitting function layers (exemplified by including three light emitting function layers: an electron transfer layer 2, a quantum dot light emitting layer 3 and a hole transfer layer 4) and a cathode 5 which are disposed in a stacked mode. At one of the one or more light emitting function layers includes at least two sub-function layers, for example, as shown in FIG. 1 and FIG. 2, the electron transfer layer 2 includes at least two sub-function layers, as shown in FIG. 3 and FIG. 4, the quantum dot light emitting layer 3 includes at least two sub-function layers, and as shown in FIG. 5 and FIG. 6, the hole transfer layer 4 includes at least two sub-function layers. The sub-function layers of all the light emitting function layers are introduced later in detail. Each sub-function layer includes ligands, and surface energy of the ligands corresponding to the sub-function layers gradiently changes in a transmission direction (arrow directions in FIGS. 1-6) of carriers in the sub-function layers, so that energy levels of the sub-function layers gradiently change.

According to the quantum dot light emitting device provided by an embodiment of the present disclosure, at least one of the one or more light emitting function layers is disposed to include at least two sub-function layers, each sub-function layer includes the ligands, and the surface energy of the ligands corresponding to the sub-function layers gradiently changes in the transmission direction of the carriers in the sub-function layers, so that the energy levels of the sub-function layers gradiently change; and in this way, the energy levels of the sub-function layers can be matched with the energy levels of the adjacent light emitting function layers so that carrier transmission and balance as well as device efficiency can be improved.

During specific implementation, in the above quantum dot light emitting device provided by an embodiment of the present disclosure, since organic electroluminescent devices have bottom emitting and top emitting, a bottom emitting device structure is formed by disposing a transparent anode and reflective cathode structure, and on the contrary, a top light emitting device structure is formed through a transparent cathode and reflective anode structure. Accordingly, different transparent materials are selected according to different device structures, usually transparent or semitransparent materials with high work functions, such as ITO, Ag, NiO, Al and graphene.

Figure 7:
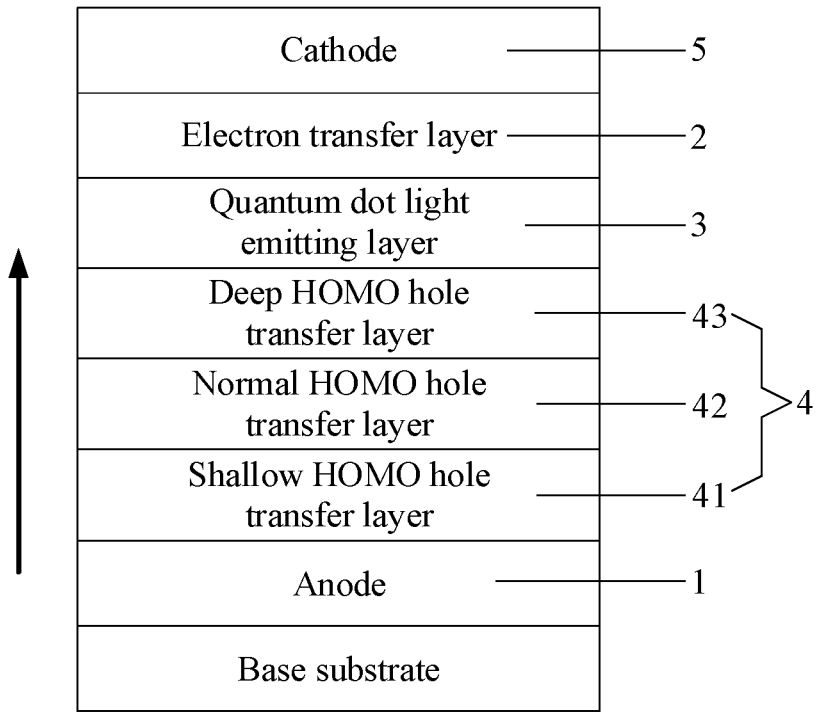
FIG. 7 is a schematic structural diagrams of another quantum dot light emitting device provided by an embodiment of the present disclosure.
Figure 8:
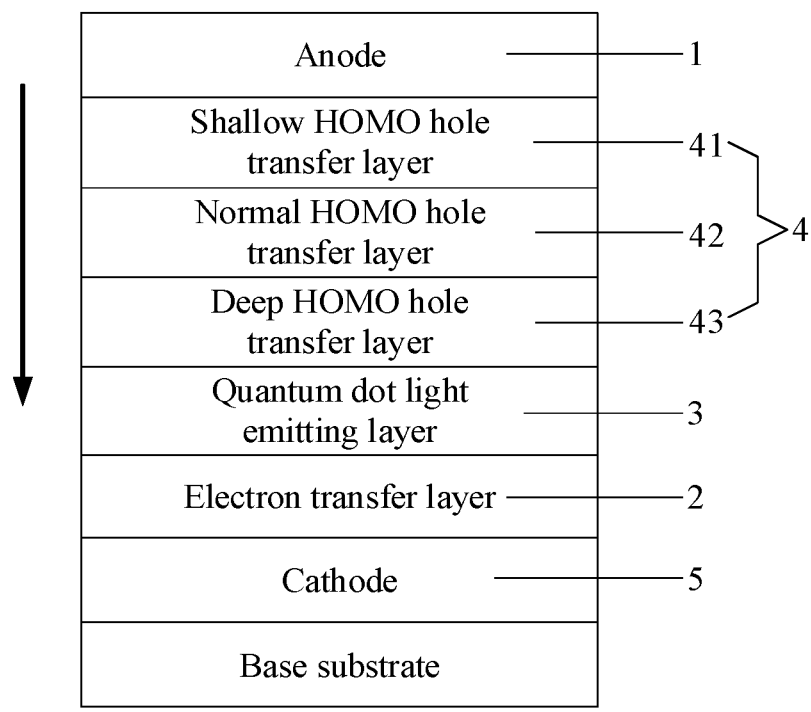
FIG. 8 is a schematic structural diagrams of still another quantum dot light emitting device provided by an embodiment of the present disclosure.

During specific implementation, in the above quantum dot light emitting device provided by an embodiment of the present disclosure, as shown in FIGS. 1-8, at least one of the one or more light emitting function layers includes three sub-function layers. For example, as shown in FIG. 1 and FIG. 2, the electron transfer layer 2 includes three sub-function layers. As shown in FIGS. 3-6, the quantum dot light emitting layer 3 includes three sub-function layers. As shown in FIG. 7 and FIG. 8, the hole transfer layer 4 includes three sub-function layers.

During specific implementation, in the above quantum dot light emitting device provided by an embodiment of the present disclosure, the ligands include: fluorine-containing group ligands with low surface energy, and hydrophobic amine ligands and hydrophilic amine ligands with high surface energy. Optionally, the fluorine-containing group ligands have low surface energy generally, and sub-function layers with low surface energy tend to gather on an upper surface of a film layer. For example, if it is desired that the sub-function layer with the highest energy level in the three sub-function layers is located on the topmost, the sub-function layer with the highest energy level is modified with the fluorine-containing group ligands. If it is desired that the sub-function layer with the lowest energy level in the three sub-function layers is located on the topmost, the sub-function layer with the lowest energy level is modified with the fluorine-containing group ligands.

The surface energy of the hydrophobic amine ligands and the hydrophilic amine ligands is higher than the surface energy of the fluorine-containing group ligands, but the magnitude of the surface energy of the hydrophobic amine ligands and the hydrophilic amine ligands is related to hydrophilic and hydrophobic properties of a front film layer. Optionally, when the light emitting function layers are manufactured on a hydrophilic film layer (front film layer), the surface energy of the hydrophilic amine ligands is greater than that of the hydrophobic amine ligands. The sub-function layers with high surface energy tend to gather on a lower surface of a film layer. For example, if it is desired that the sub-function layer with the highest energy level in the three sub-function layers is located on the lowermost, the sub-function layer with the highest energy level is modified with the hydrophilic amine ligands. If it is desired that the sub-function layer with the normal energy level in the three sub-function layers is located in the middle, the sub-function layer with the normal energy level is modified with the hydrophobic amine ligands.

When the light emitting function layers are manufactured on a hydrophobic film layer (front film layer), the surface energy of the hydrophobic amine ligands is greater than that of the hydrophilic amine ligands. For example, if it is desired that the sub-function layer with the highest energy level in the three sub-function layers is located on the lowermost, the sub-function layer with the highest energy level is modified with the hydrophobic amine ligands. If it is desired that the sub-function layer with the normal energy level in the three sub-function layers is located in the middle, the sub-function layer with the normal energy level is modified with the hydrophilic amine ligands.

Accordingly, when the light emitting function layers are manufactured on the hydrophilic film layer (front film layer), the surface energy of the hydrophilic amine ligands>the surface energy of the hydrophobic amine ligands>the surface energy of the fluorine-containing group ligands. When the light emitting function layers are manufactured on the hydrophobic film layer (front film layer), the surface energy of the hydrophobic amine ligands>the surface energy of the hydrophilic amine ligands>the surface energy of the fluorine-containing group ligands. Accordingly, in the carrier transmission direction, the ligands may be selected for modification according to the magnitude of the energy levels of the sub-function layers, so that the energy levels of the sub-function layers gradiently change in the transmission direction of the carriers in the sub-function layers.

During specific implementation, in above quantum dot light emitting device provided by an embodiment of the present disclosure, the hydrophilic amine ligands generally include alcohol amine ligands, such as ethanol amine; and the hydrophobic amine ligands generally include alkane amine ligands, such as n-propylamine and normal hexyl amine. Specifically, taking the ethanol amine and the normal hexyl amine as an example, when the light emitting function layers are manufactured on the hydrophilic film layer (front film layer), the surface energy of ethanol amine ligands>the surface energy of normal hexyl amine ligands>the surface energy of the fluorine-containing group ligands. When the light emitting function layers are manufactured on the hydrophobic film layer (front film layer), the surface energy of the normal hexyl amine ligands>the surface energy of the ethanol amine ligands>the surface energy of the fluorine-containing group ligands.

During specific implementation, in the above quantum dot light emitting device provided by an embodiment of the present disclosure, as shown in FIGS. 1-8, the light emitting function layers include the electron transfer layer 2, the quantum dot light emitting layer 3 and the hole transfer layer 4. The electron transfer layer 2 is close to the cathode 5, and the hole transfer layer 4 is close to the anode 1. At least one of the electron transfer layer 2, the quantum dot light emitting layer 3 and the hole transfer layer 4 includes three sub-function layers. Optionally, as shown in FIG. 1 and FIG. 2, the electron transfer layer 2 includes three sub-function layers. As shown in FIGS. 3-6, the quantum dot light emitting layer 3 includes three sub-function layers. As shown in FIG. 7 and FIG. 8, the hole transfer layer 4 includes three sub-function layers.

During specific implementation, in the above quantum dot light emitting device provided by an embodiment of the present disclosure, a material of the quantum dot light emitting layer may be a binary, ternary or polynary quantum dot light emitting material, which is not listed one by one here.

Optionally, an electroluminescent device includes an upright type device and an inverted type device, an inverted type structure and an upright type structure are different in that sequences of manufacturing film layers on a base substrate are opposite, a manufacturing sequence of the upright type is that an anode, a hole injection layer, a hole transfer layer, a quantum dot light emitting layer, an electron transfer layer and a cathode are sequentially manufactured on the base substrate, and a manufacturing sequence of the inverted type is that a cathode, an electron transfer layer, a quantum dot light emitting layer, a hole transfer layer, a hole injection layer and an anode are sequentially manufactured on the base substrate.

Optionally, the cathode, the anode, the hole injection layer and the electron transfer layer are hydrophilic, and the hole transfer layer and the quantum dot light emitting layer are hydrophobic.

Optionally, hydrophilicity means a property of water affinity. Hydrophobicity means a property of water repulsion.

Optionally, a semiconductor material generally has a HOMO energy level or a LUMO energy level. The HOMO energy level means a distance between a lowest edge of a semiconductor material energy band and a vacuum energy level. The LUMO energy level means a distance between an uppermost edge of the semiconductor material energy band and the vacuum energy level. No matter the HOMO energy level or the LUMO energy level, the larger the distance from the vacuum energy level, the larger an absolute value of a distance value, which may be expressed as the deeper the energy level; and on the contrary, the shallower the energy level.

During specific implementation, in the above quantum dot light emitting device provided by an embodiment of the present disclosure, as shown in FIG. 1 and FIG. 2, FIG. 1 is the upright type structure, and FIG. 2 is the inverted type structure. The electron transfer layer 2 includes a first sub-function layer 21, a second sub-function layer 22 and a third sub-function layer 23 which are disposed in a stacked mode, the first sub-function layer 21 is close to the quantum dot light emitting layer 3, and the third sub-function layer 23 is close to the cathode 5. The LUMO energy levels of the first sub-function layer 21, the second sub-function layer 22 and the third sub-function layer 23 are gradually deepened. As shown in FIG. 1, the surface energy of the first sub-function layer 21, the second sub-function layer 22 and the third sub-function layer 23 is gradually decreased. As shown in FIG. 2, the surface energy of the first sub-function layer 21, the second sub-function layer 22 and the third sub-function layer 23 is gradually increased. Optionally, electrons of the cathode 5 are transferred into the quantum dot light emitting layer 3 through the electron transfer layer 2, and a barrier difference between a single electron transfer layer 2 and a quantum dot light emitting layer 3 in the prior art is large, that is, the LUMO energy level of the electron transfer layer 2 is deeper than the LUMO energy level of the quantum dot light emitting layer 3, resulting in low electron transfer efficiency. In the present disclosure, by disposing the electron transfer layer 2 to include the first sub-function layer 21, the second sub-function layer 22 and the third sub-function layer 23 with the LUMO energy levels gradually deepened, a stepped barrier is formed between the quantum dot light emitting layer 3 and the cathode 5, so that the electron injection capability of the electron transfer layer is gradually increased, and the electron injection requirement of the quantum dot light emitting device is met. Besides, the first sub-function layer 21, the second sub-function layer 22 and the third sub-function layer 23 of the present disclosure all include ligands, as shown in FIG. 1, in the transmission direction (the arrow direction in FIG. 1) of the carriers in the sub-function layers, the surface energy of the ligands corresponding to the third sub-function layer 23, the second sub-function layer 22 and the first sub-function layer 21 is gradually increased, and due to the difference of the surface energy, the third sub-function layer 23 with the lowest surface energy tends to gather on an upper surface of the electron transfer layer 2, the first sub-function layer 21 with the highest surface energy tends to gather on a lower surface of the electron transfer layer 2, and the second sub-function layer 22 with the intermediate surface energy gathers in the middle of the electron transfer layer 2. In this way, three electron transfer materials with different energy levels and correspondingly having three surface energy ligands may be mixed and then form a film through spin-coating, so that the third sub-function layer 23 with the lowest surface energy is closest to the cathode 5, the first sub-function layer 21 with the highest surface energy is closest to the quantum dot light emitting layer 3, and the second sub-function layer 22 with the intermediate surface energy is located between the first sub-function layer 21 and the third sub-function layer 23. Therefore, the LUMO energy level of the electron transfer layer 2 may be matched with the HOMO energy level of the quantum dot light emitting layer 3 so that carrier transmission and balance as well as device efficiency can be improved. As shown in FIG. 2, in the transmission direction (the arrow direction in FIG. 2) of the carriers in the sub-function layers, the surface energy of the ligands corresponding to the third sub-function layer 23, the second sub-function layer 22 and the first sub-function layer 21 is gradually decreased, and due to the difference of the surface energy, the first sub-function layer 21 with the lowest surface energy tends to gather on the upper surface of the electron transfer layer 2, the third sub-function layer 23 with the highest surface energy tends to gather on the lower surface of the electron transfer layer 2, and the second sub-function layer 22 with the intermediate surface energy gathers in the middle of the electron transfer layer 2. In this way, three electron transfer materials with different energy levels and correspondingly having three surface energy ligands may be mixed and then form a film through spin-coating, so that the third sub-function layer 23 with the highest surface energy is closest to the cathode 5, the first sub-function layer 21 with the lowest surface energy is closest to the quantum dot light emitting layer 3, and the second sub-function layer 22 with the intermediate surface energy is located between the first sub-function layer 21 and the third sub-function layer 23. Therefore, the LUMO energy level of the electron transfer layer 2 may be matched with the LUMO energy level of the quantum dot light emitting layer 3 so that carrier transmission and balance as well as device efficiency can be improved.

During specific implementation, in the above quantum dot light emitting device provided by an embodiment of the present disclosure, in the upright type structure shown in FIG. 1, when the electron transfer layer 2 is manufactured on the hydrophobic film layer (the quantum dot light emitting layer 3), that is, the quantum dot light emitting layer 3 is the front film layer, since the first sub-function layer 21 with the shallowest energy level is located at the lowermost, the first sub-function layer 21 needs to be modified with the hydrophobic amine ligands with the highest surface energy, the second sub-function layer 22 needs to be modified with the hydrophilic amine ligands with the intermediate surface energy, and the third sub-function layer 23 needs to be modified with the fluorine-containing group ligands with the lowest surface energy.

During specific implementation, a material of the electron transfer layer is generally zinc oxide, the energy level of the electron transfer layer may be adjusted by doping metal ions, such as magnesium ions, into the zinc oxide, and since the electron transfer layer is at the LUMO energy level, the more the amount of the doped magnesium ions, the shallower the energy level. Therefore, in the above quantum dot light emitting device provided by the embodiment of the present disclosure, as shown in FIG. 1, a material of the first sub-function layer 21 is magnesium zinc oxide nanoparticles with hydrophobic amine as the ligands, and molar mass of magnesium is 0% to 50% that of magnesium zinc oxide; a material of the second sub-function layer 22 is magnesium zinc oxide nanoparticles with hydrophilic amine as the ligands, and molar mass of magnesium is 0% to 50% that of magnesium zinc oxide; and a material of the third sub-function layer 23 is zinc oxide nanoparticles with fluorine-containing groups as the ligands, and content of the magnesium in the first sub-function layer is greater than content of the magnesium in the second sub-function layer. Optionally, the molar mass of the magnesium in the second sub-function layer 22 is 5% that of the magnesium zinc oxide, and the molar mass of the magnesium in the first sub-function layer 21 is 15% that of the magnesium zinc oxide. Therefore, the energy levels of the first sub-function layer 21, the second sub-function layer 22 and the third sub-function layer 23 may be determined based on the content of the magnesium ions doped in zinc oxide, and modification ligand types in all the film layers may be determined according to a film layer position relationship between the first sub-function layer 21, the second sub-function layer 22 and the third sub-function layer 23.

During specific implementation, in the above quantum dot light emitting device provided by an embodiment of the present disclosure, in the inverted type structure shown in FIG. 2, when the electron transfer layer 2 is manufactured on the hydrophilic film layer (the cathode 5), that is, the cathode 5 is the front film layer, since the first sub-function layer 21 with the shallowest energy level is located at the uppermost, the first sub-function layer 21 needs to be modified with the fluorine-containing group ligands with the lowest surface energy, the second sub-function layer 22 needs to be modified with the hydrophobic amine ligands with the intermediate surface energy, and the third sub-function layer 23 needs to be modified with the hydrophilic amine ligands with the highest surface energy.

During specific implementation, the material of the electron transfer layer is generally the zinc oxide, the energy level of the electron transfer layer may be adjusted by doping the metal ions, such as the magnesium ions, into the zinc oxide, and since the electron transfer layer is at the LUMO energy level, the more the amount of the doped magnesium ions, the shallower the energy level. Therefore, in the above quantum dot light emitting device provided by the embodiment of the present disclosure, as shown in FIG. 2, the material of the first sub-function layer 21 is magnesium zinc oxide nanoparticles with the fluorine-containing groups as the ligands, and molar mass of magnesium is 0% to 50% that of magnesium zinc oxide; the material of the second sub-function layer 22 is magnesium zinc oxide nanoparticles with hydrophobic amine as the ligands, and molar mass of magnesium is 0% to 50% that of magnesium zinc oxide; and the material of the third sub-function layer 23 is zinc oxide nanoparticles with hydrophilic amine as the ligands, and content of the magnesium in the first sub-function layer is greater than content of the magnesium in the second sub-function layer. Specifically, the molar mass of the magnesium in the second sub-function layer 22 is 5% that of the magnesium zinc oxide, and the molar mass of the magnesium in the first sub-function layer 21 is 15% that of the magnesium zinc oxide.

During specific implementation, in the above quantum dot light emitting device provided by an embodiment of the present disclosure, as shown in FIG. 3 and FIG. 4, the quantum dot light emitting layer 3 includes a fourth sub-function layer 31, a fifth sub-function layer 32 and a sixth sub-function layer 33 which are disposed in a stacked mode, the fourth sub-function layer 31 is close to the hole transfer layer 4, and the sixth sub-function layer 33 is close to the electron transfer layer 2. The HOMO energy levels of the fourth sub-function layer 31, the fifth sub-function layer 32 and the sixth sub-function layer 33 are gradually deepened. As shown in FIG. 3, the surface energy of the fourth sub-function layer 31, the fifth sub-function layer 32 and the sixth sub-function layer 33 is gradually decreased. As shown in FIG. 4, the surface energy of the fourth sub-function layer 31, the fifth sub-function layer 32 and the sixth sub-function layer 33 is gradually increased. Optionally, holes of the anode 1 are transferred into the quantum dot light emitting layer 3 through the hole transfer layer 4, and a barrier difference between a single hole transfer layer 4 and a single quantum dot light emitting layer 3 in the prior art is large, that is, the HOMO energy level of the quantum dot light emitting layer 3 is deeper than the HOMO energy level of the hole transfer layer 4, resulting in low hole transfer efficiency. In the present disclosure, by disposing the quantum dot light emitting layer 4 to include the fourth sub-function layer 31, the fifth sub-function layer 32 and the sixth sub-function layer 33 with the HOMO energy levels gradually deepened, a stepped barrier is formed between the quantum dot light emitting layer 3 and the anode 1, so that the hole injection capability of the hole transfer layer is gradually increased, and the hole injection requirement of the quantum dot light emitting device is met. Besides, the fourth sub-function layer 31, the fifth sub-function layer 32 and the sixth sub-function layer 33 of the present disclosure all include ligands, as shown in FIG. 3, in the transmission direction (the arrow direction in FIG. 3) of the carriers in the sub-function layers, the surface energy of the ligands corresponding to the fourth sub-function layer 31, the fifth sub-function layer 32 and the sixth sub-function layer 33 is gradually decreased, and due to the difference of the surface energy, the sixth sub-function layer 33 with the lowest surface energy tends to gather on an upper surface of the quantum dot light emitting layer 3, the fourth sub-function layer 31 with the highest surface energy tends to gather on a lower surface of the quantum dot light emitting layer 3, and the fifth sub-function layer 32 with the intermediate surface energy gathers in the middle of the quantum dot light emitting layer 3. In this way, three quantum dot materials with different energy levels and correspondingly having three surface energy ligands may be mixed and then form a film through spin-coating, so that the sixth sub-function layer 33 with the lowest surface energy is closest to the electron transfer layer 2, the fourth sub-function layer 31 with the highest surface energy is closest to the hole transfer layer 4, and the fifth sub-function layer 32 with the intermediate surface energy is located between the fourth sub-function layer 31 and the sixth sub-function layer 33. Therefore, the HOMO energy level of the hole transfer layer 4 may be matched with the HOMO energy level of the quantum dot light emitting layer 3 so that carrier transmission and balance as well as device efficiency can be improved. As shown in FIG. 4, in the transmission direction (the arrow direction in FIG. 4) of the carriers in the sub-function layers, the surface energy of the ligands corresponding to the fourth sub-function layer 31, the fifth sub-function layer 32 and the sixth sub-function layer 33 is gradually increased, and due to the difference of the surface energy, the fourth sub-function layer 31 with the lowest surface energy tends to gather on the upper surface of the quantum dot light emitting layer 3, the sixth sub-function layer 33 with the highest surface energy tends to gather on the lower surface of the quantum dot light emitting layer 3, and the fifth sub-function layer 32 with the intermediate surface energy gathers in the middle of the quantum dot light emitting layer 3. In this way, three quantum dot materials with different energy levels and correspondingly having three surface energy ligands may be mixed and then form a film through spin-coating, so that the fourth sub-function layer 31 with the lowest surface energy is closest to the hole transfer layer 4, the sixth sub-function layer 33 with the highest surface energy is closest to the electron transfer layer 2, and the fifth sub-function layer 32 with the intermediate surface energy is located between the fourth sub-function layer 31 and the sixth sub-function layer 33. Therefore, the HOMO energy level of the hole transfer layer 4 may be matched with the HOMO energy level of the quantum dot light emitting layer 3 so that carrier transmission and balance as well as device efficiency can be improved.

During specific implementation, quantum dots emit light of different colors by regulating a particle size of the quantum dots, however, the quantum dots emitting the light of different colors are the same in structure, that is, the quantum dots are the same in core-shell part and may be different in surface ligand, and thus if quantum dot light emitting layers having different energy levels are to be obtained, the quantum dots may be modified with different ligands. A ligand material of the quantum dots having a shallow HOMO energy level may be a triphenylamine or carbazole ligand material, a ligand material of the quantum dots having an intermediate HOMO energy level may be an alkane ligand, and a ligand material of the quantum dots having a deep HOMO energy level may be a pyridine ligand material.

Accordingly, in the above quantum dot light emitting device provided by some embodiments of the present disclosure, as shown in FIG. 3 and FIG. 4, the ligands of the fourth sub-function layer 31 with the shallowest energy level have triphenylamine or carbazole ligands, the ligands of the fifth sub-function layer with the normal energy level have alkane ligands, and the ligands of the sixth sub-function layer with the deepest energy level have pyridine ligands.

During specific implementation, in the above quantum dot light emitting device provided by an embodiment of the present disclosure, in the upright type structure shown in FIG. 3, when the quantum dot light emitting layer 3 is manufactured on the hydrophobic film layer (hole transfer layer 4), since the fourth sub-function layer 31 is located at the lowermost, the ligands of the fourth sub-function layer 31 further have hydrophobic amine ligands, since the sixth sub-function layer 33 is located at the uppermost, the ligands of the sixth sub-function layer 33 further have fluorine-containing group ligands, and the ligands of the fifth sub-function layer 32 located in the middle further have hydrophilic amine ligands.

During specific implementation, in the above quantum dot light emitting device provided by an embodiment of the present disclosure, in the inverted type structure shown in FIG. 4, when the quantum dot light emitting layer 3 is manufactured on the hydrophilic film layer (electron transfer layer 2), since the fourth sub-function layer 31 is located at the uppermost, the ligands of the fourth sub-function layer 31 further have fluorine-containing group ligands, since the sixth sub-function layer 33 is located at the lowermost, the ligands of the sixth sub-function layer 33 further have hydrophilic amine ligands, and the ligands of the fifth sub-function layer 32 located in the middle further have hydrophobic amine ligands.

During specific implementation, in the above quantum dot light emitting device provided by an embodiment of the present disclosure, as shown in FIG. 5 and FIG. 6, the quantum dot light emitting layer 3 includes the fourth sub-function layer 31, the fifth sub-function layer 32 and the sixth sub-function layer 33 which are disposed in the stacked mode, the fourth sub-function layer 31 is close to the hole transfer layer 4, and the sixth sub-function layer 33 is close to the electron transfer layer 2. The LUMO energy levels of the fourth sub-function layer 31, the fifth sub-function layer 32 and the sixth sub-function layer 33 are gradually deepened. As shown in FIG. 5, the surface energy of the fourth sub-function layer 31, the fifth sub-function layer 32 and the sixth sub-function layer 33 is gradually decreased. As shown in FIG. 6, the surface energy of the fourth sub-function layer 31, the fifth sub-function layer 32 and the sixth sub-function layer 33 is gradually increased. Optionally, as shown in FIG. 5, electrons of the cathode 5 are transferred into the quantum dot light emitting layer 3 through the electron transfer layer 2, and a barrier difference between a single electron transfer layer 2 and a quantum dot light emitting layer 3 in the prior art is large, that is, the LUMO energy level of the electron transfer layer 2 is deeper than the LUMO energy level of the quantum dot light emitting layer 3, resulting in low electron transfer efficiency. In the present disclosure, by disposing the quantum dot light emitting layer 3 to include the fourth sub-function layer 31, the fifth sub-function layer 32 and the sixth sub-function layer 33 with the LUMO energy levels gradually deepened, a stepped barrier is formed between the quantum dot light emitting layer 3 and the cathode 5, so that the electron injection capability of the electron transfer layer is gradually increased, and the electron injection requirement of the quantum dot light emitting device is met. Besides, the fourth sub-function layer 31, the fifth sub-function layer 32 and the sixth sub-function layer 33 of the present disclosure all include the ligands, as shown in FIG. 5, in the transmission direction (the arrow direction in FIG. 5) of the carriers in the sub-function layers, the surface energy of the ligands corresponding to the fourth sub-function layer 31, the fifth sub-function layer 32 and the sixth sub-function layer 33 is gradually decreased, and due to the difference of the surface energy, the sixth sub-function layer 33 with the lowest surface energy tends to gather on the upper surface of the quantum dot light emitting layer 3, the fourth sub-function layer 31 with the highest surface energy tends to gather on the lower surface of the quantum dot light emitting layer 3, and the fifth sub-function layer 32 with the intermediate surface energy gathers in the middle of the quantum dot light emitting layer 3. In this way, three quantum dot materials with different energy levels and correspondingly having three surface energy ligands may be mixed and then form a film through spin-coating, so that the sixth sub-function layer 33 with the lowest surface energy is closest to the electron transfer layer 2, the fourth sub-function layer 31 with the highest surface energy is closest to the hole transfer layer 4, and the fifth sub-function layer 32 with the intermediate surface energy is located between the fourth sub-function layer 31 and the sixth sub-function layer 33. Therefore, the LUMO energy level of the electron transfer layer 2 may be matched with the LUMO energy level of the quantum dot light emitting layer 3 so that carrier transmission and balance as well as device efficiency can be improved. As shown in FIG. 6, in the transmission direction (the arrow direction in FIG. 6) of the carriers in the sub-function layers, the surface energy of the ligands corresponding to the fourth sub-function layer 31, the fifth sub-function layer 32 and the sixth sub-function layer 33 is gradually increased, and due to the difference of the surface energy, the fourth sub-function layer 31 with the lowest surface energy tends to gather on the upper surface of the quantum dot light emitting layer 3, the sixth sub-function layer 33 with the highest surface energy tends to gather on the lower surface of the quantum dot light emitting layer 3, and the fifth sub-function layer 32 with the intermediate surface energy gathers in the middle of the quantum dot light emitting layer 3. In this way, three quantum dot materials with different energy levels and correspondingly having three surface energy ligands may be mixed and then form a film through spin-coating, so that the fourth sub-function layer 31 with the lowest surface energy is closest to the hole transfer layer 4, the sixth sub-function layer 33 with the highest surface energy is closest to the electron transfer layer 2, and the fifth sub-function layer 32 with the intermediate surface energy is located between the fourth sub-function layer 31 and the sixth sub-function layer 33. Therefore, the LUMO energy level of the electron transfer layer 4 may be matched with the LUMO energy level of the quantum dot light emitting layer 3 so that carrier transmission and balance as well as device efficiency can be improved.

During specific implementation, in the above quantum dot light emitting device provided by an embodiment of the present disclosure, in the upright type structure shown in FIG. 5, when the quantum dot light emitting layer 3 is manufactured on the hydrophobic film layer (hole transfer layer 4), since the fourth sub-function layer 31 is located at the lowermost, the ligands of the fourth sub-function layer 31 further have hydrophobic amine ligands, since the sixth sub-function layer 33 is located at the uppermost, the ligands of the sixth sub-function layer 33 further have fluorine-containing group ligands, and the ligands of the fifth sub-function layer 32 located in the middle further have hydrophilic amine ligands.

During specific implementation, in the above quantum dot light emitting device provided by an embodiment of the present disclosure, in the inverted type structure shown in FIG. 6, when the quantum dot light emitting layer 3 is manufactured on the hydrophilic film layer (electron transfer layer 2), since the fourth sub-function layer 31 is located at the uppermost, the ligands of the fourth sub-function layer further have fluorine-containing group ligands, since the sixth sub-function layer 33 is located at the lowermost, the ligands of the sixth sub-function layer 33 further have hydrophilic amine ligands, and the ligands of the fifth sub-function layer 32 located in the middle further have hydrophobic amine ligands.

During specific implementation, in the above quantum dot light emitting device provided by an embodiment of the present disclosure, as shown in FIG. 7 and FIG. 8, FIG. 7 is an upright type structure, and FIG. 8 is an inverted type structure. The hole transfer layer 4 includes a seventh sub-function layer 41, an eighth sub-function layer 42 and a ninth sub-function layer 43 which are disposed in a stacked mode, the seventh sub-function layer 41 is close to the anode 1, and the ninth sub-function layer 43 is close to the quantum dot light emitting layer 3. The HOMO energy levels of the seventh sub-function layer 41, the eighth sub-function layer 42 and the ninth sub-function layer 43 are gradually deepened. As shown in FIG. 7, the surface energy of the seventh sub-function layer 41, the eighth sub-function layer 42 and the ninth sub-function layer 43 is gradually decreased. As shown in FIG. 8, the surface energy of the seventh sub-function layer 41, the eighth sub-function layer 42 and the ninth sub-function layer 43 is gradually increased. Specifically, holes of the anode 1 are transferred into the quantum dot light emitting layer 3 through the hole transfer layer 4, and a barrier difference between a single hole transfer layer 4 and a quantum dot light emitting layer 3 in the prior art is large, that is, the HOMO energy level of the quantum dot light emitting layer 3 is deeper than the HOMO energy level of the hole transfer layer 4, resulting in low hole transfer efficiency. In the present disclosure, by disposing the hole transfer layer 4 to include the seventh sub-function layer 41, the eighth sub-function layer 42 and the ninth sub-function layer 43 with the HOMO energy levels gradually deepened, a stepped barrier is formed between the quantum dot light emitting layer 3 and the anode 1, so that the hole injection capability of the hole transfer layer is gradually increased, and the hole injection requirement of the quantum dot light emitting device is met. Besides, the seventh sub-function layer 41, the eighth sub-function layer 42 and the ninth sub-function layer 43 of the present disclosure all include ligands, as shown in FIG. 7, in the transmission direction (the arrow direction in FIG. 7) of the carriers in the sub-function layers, the surface energy of the ligands corresponding to the seventh sub-function layer 41, the eighth sub-function layer 42 and the ninth sub-function layer 43 is gradually decreased, and due to the difference of the surface energy, the ninth sub-function layer 43 with the lowest surface energy tends to gather on an upper surface of the hole transfer layer 4, the seventh sub-function layer 41 with the highest surface energy tends to gather on a lower surface of the hole transfer layer 4, and the eighth sub-function layer 42 with the intermediate surface energy gathers in the middle of the hole transfer layer 4. In this way, three hole transfer materials with different energy levels and correspondingly having three surface energy ligands may be mixed and then form a film through spin-coating, so that the ninth sub-function layer 43 with the lowest surface energy is closest to the quantum dot light emitting layer 3, the seventh sub-function layer 41 with the highest surface energy is closest to the anode 1, and the eighth sub-function layer 42 with the intermediate surface energy is located between the seventh sub-function layer 41 and the ninth sub-function layer 43. Therefore, the HOMO energy level of the hole transfer layer 4 may be matched with the HOMO energy level of the quantum dot light emitting layer 3 so that carrier transmission and balance as well as device efficiency can be improved. As shown in FIG. 8, in the transmission direction (the arrow direction in FIG. 8) of the carriers in the sub-function layers, the surface energy of the ligands corresponding to the seventh sub-function layer 41, the eighth sub-function layer 42 and the ninth sub-function layer 43 is gradually increased, and due to the difference of the surface energy, the seventh sub-function layer 41 with the lowest surface energy tends to gather on the upper surface of the hole transfer layer 4, the ninth sub-function layer 43 with the highest surface energy tends to gather on the lower surface of the hole transfer layer 4, and the eighth sub-function layer 42 with the intermediate surface energy gathers in the middle of the hole transfer layer 4. In this way, three hole transfer materials with different energy levels and correspondingly having three surface energy ligands may be mixed and then form a film through spin-coating, so that the seventh sub-function layer 41 with the lowest surface energy is closest to the anode 1, the ninth sub-function layer 43 with the highest surface energy is closest to the quantum dot light emitting layer 3, and the eighth sub-function layer 42 with the intermediate surface energy is located between the seventh sub-function layer 41 and the ninth sub-function layer 43. Therefore, the HOMO energy level of the hole transfer layer 4 may be matched with the HOMO energy level of the quantum dot light emitting layer 3 so that carrier transmission and balance as well as device efficiency can be improved.

During specific implementation, in the above quantum dot light emitting device provided by an embodiment of the present disclosure, in the upright type structure shown in FIG. 7, when the hole transfer layer 4 is manufactured on the hydrophilic film layer (the anode 1), since the ninth sub-function layer 43 with the deepest energy level is located at the uppermost, the ninth sub-function layer 43 needs to be modified with the fluorine-containing group ligands with the lowest surface energy, the eighth sub-function layer 42 needs to be modified with the hydrophobic amine ligands with the intermediate surface energy, and the seventh sub-function layer 41 needs to be modified with the hydrophilic amine ligands with the highest surface energy.

During specific implementation, a material of the hole transfer layer is generally nickel oxide, the energy level of the hole transfer layer may be adjusted by doping metal ions, such as cesium ions, into the nickel oxide, and since the hole transfer layer is at the HOMO energy level, the more the amount of the doped cesium ions, the deeper the energy level. Therefore, in the above quantum dot light emitting device provided by the embodiment of the present disclosure, as shown in FIG. 7, a material of the seventh sub-function layer 41 is nickel oxide nanoparticles with hydrophilic amine as the ligands; a material of the eighth sub-function layer 42 is nickel cesium oxide nanoparticles with hydrophobic amine as the ligands, and molar mass of cesium is 0% to 50% that of nickel cesium oxide; and a material of the ninth sub-function layer 43 is nickel cesium oxide nanoparticles with fluorine-containing groups as the ligands, molar mass of cesium is 0% to 50% that of nickel cesium oxide, and content of the cesium in the ninth sub-function layer 43 is greater than content of the cesium in the eighth sub-function layer 42. Optionally, the molar mass of the cesium in the eighth sub-function layer 42 is 5% that of the nickel cesium oxide, and the molar mass of the cesium in the ninth sub-function layer 43 is 15% that of the nickel cesium oxide.

During specific implementation, in the above quantum dot light emitting device provided by an embodiment of the present disclosure, in the inverted type structure shown in FIG. 8, when the hole transfer layer 4 is manufactured on the hydrophobic film layer (the quantum dot light emitting layer 3), since the ninth sub-function layer 43 with the deepest energy level is located at the lowermost, the ninth sub-function layer 43 needs to be modified with the hydrophobic amine ligands with the highest surface energy, the eighth sub-function layer 42 needs to be modified with the hydrophilic amine ligands with the intermediate surface energy, and the seventh sub-function layer 41 needs to be modified with the fluorine-containing group ligands with the lowest surface energy.

During specific implementation, the material of the hole transfer layer is generally the nickel oxide, the energy level of the hole transfer layer may be adjusted by doping the metal ions, such as the cesium ions, into the nickel oxide, and since the hole transfer layer is at the HOMO energy level, the more the amount of the doped cesium ions, the deeper the energy level. Therefore, in the above quantum dot light emitting device provided by the embodiment of the present disclosure, as shown in FIG. 8, the material of the seventh sub-function layer 41 is nickel oxide nanoparticles with fluorine-containing groups as the ligands; the material of the eighth sub-function layer 42 is nickel cesium oxide nanoparticles with hydrophilic amine as the ligands, and molar mass of cesium is 0% to 50% that of nickel cesium oxide; and the material of the ninth sub-function layer 43 is nickel cesium oxide nanoparticles with hydrophobic amine as the ligands, molar mass of cesium is 0% to 50% that of nickel cesium oxide, and content of the cesium in the ninth sub-function layer 43 is greater than content of the cesium in the eighth sub-function layer 42. Optionally, the molar mass of the cesium in the eighth sub-function layer 42 is 5% that of the nickel cesium oxide, and the molar mass of the cesium in the ninth sub-function layer 43 is 15% that of the nickel cesium oxide.

Based on the same inventive concept, an embodiment of the present disclosure further provides a preparation method of a quantum dot light emitting device, including:

an anode, one or more light emitting function layers and a cathode which are disposed in a stacked mode are formed. At least one of the one or more light emitting function layers is formed through a one-time spin-coating process and includes at least two sub-function layers. Each sub-function layer includes ligands, and surface energy of the ligands corresponding to the sub-function layers gradiently changes in a transmission direction of carriers in the sub-function layers, so that energy levels of the sub-function layers gradiently change.

In the preparation method of the quantum dot light emitting device provided by an embodiment of the present disclosure, at least two materials with different surface energy and energy levels are mixed and then form the at least two sub-function layers through the one-time spin-coating process, film layers with gradually-changing energy levels are formed by utilizing the difference of the surface energy, and thus defects between interfaces caused by multi-layer spin-coating film forming may be reduced. Besides, the energy levels of the sub-function layers gradiently change, so that the energy levels of the sub-function layers may be matched with the energy levels of the adjacent light emitting function layers, and carrier transmission and balance as well as device efficiency can be improved.

Figure 9:
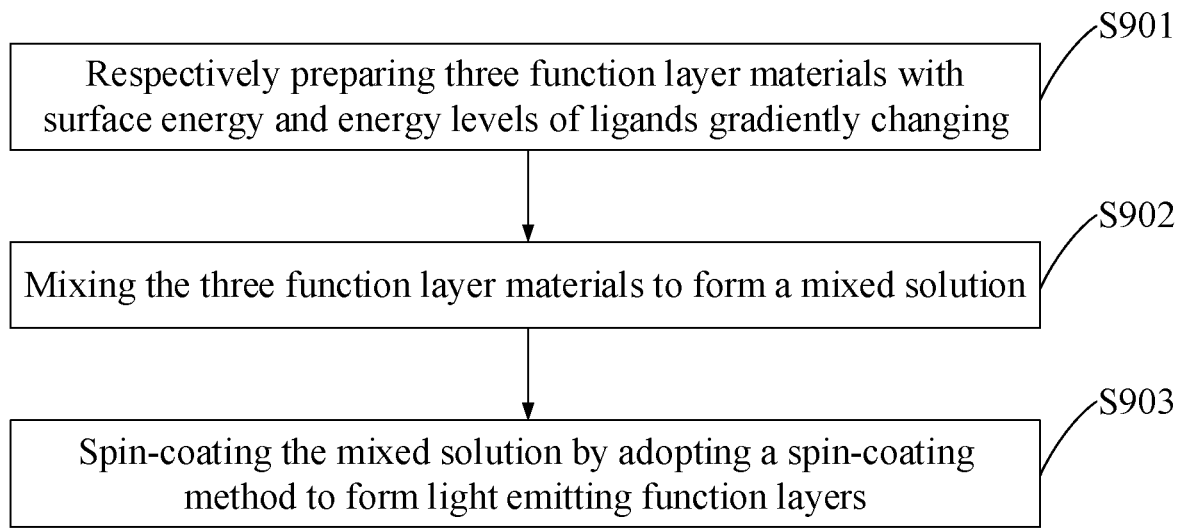
FIG. 9 is a schematic flow diagram of a preparation method of a quantum dot light emitting device provided by an embodiment of the present disclosure.

During specific implementation, in the above preparation method provided by the embodiment of the present disclosure, as shown in FIG. 9, forming the light emitting function layers, may include:

S901, three function layer materials with surface energy and energy levels of the ligands gradiently changing are respectively prepared.

Optionally, taking the structure shown in FIG. 1 as an example, an electron transfer layer 2 is manufactured on a hydrophobic quantum dot light emitting layer 3, and a method for manufacturing a first sub-function layer 21, a second sub-function layer 22 and a third sub-function layer 23 of the electron transfer layer 2 is as follows.

Preparation of the third sub-function layer 23 (zinc oxide nanoparticles with fluorine-containing groups as the ligands): with the fluorine-containing groups being pentafluoropropionamide, 3 mmol zinc acetate is dissolved in 30 ml of dimethyl sulfoxide (DMSO), 5.5 mmol tetramethylammonium hydroxide (TMAH) is dissolved in 10 ml of ethanol to form a solution, and the solution is slowly dripped into a DMSO solution of the zinc acetate and is stirred for 24 h at the room temperature. After stirring, a mixed solution is dripped into excess ethyl acetate, centrifuging is performed to obtain solid particles, the solid particles are dissolved in ethanol again, and 160 ul of pentafluoropropionamide is added therein to serve as ligands so as to stabilize the nanoparticles. A solution is further immersed into excess ethyl acetate, and after centrifuging, a solid is dissolved in ethanol to form a zinc oxide solution containing pentafluoropropionamide ligands, that is, a material of the third sub-function layer 23 is formed.

Preparation of the second sub-function layer 22 (magnesium zinc oxide nanoparticles with hydrophilic amine as the ligands, wherein molar mass of magnesium is 5% that of magnesium zinc oxide): with the hydrophilic amine being ethanol amine, 2.85 mmol zinc acetate and 0.15 mmol magnesium acetate are dissolved in 30 ml of DMSO, 5.5 mmol TMAH is dissolved in 10 ml of ethanol to form a solution, and the solution is slowly dripped into a DMSO mixed solution and is stirred for 24 h at the room temperature. After stirring, a mixed solution is dripped into excess ethyl acetate, centrifuging is performed to obtain solid particles, the solid particles are dissolved in ethanol again, and 160 ul of ethanol amine is added therein to serve as ligands so as to stabilize the nanoparticles. A solution is further immersed into excess ethyl acetate, and after centrifuging, a solid is dissolved in ethanol to form a magnesium zinc oxide (containing 5% of magnesium) solution containing ethanol amine ligands, that is, a material of the second sub-function layer 22 is formed.

Preparation of the first sub-function layer 21 (magnesium zinc oxide nanoparticles with hydrophobic amine as the ligands, wherein molar mass of magnesium is 15% that of magnesium zinc oxide): with the hydrophobic amine being normal hexyl amine, 2.55 mmol zinc acetate and 0.45 mmol magnesium acetate are dissolved in 30 ml of DMSO, 5.5 mmol TMAH is dissolved in 10 ml of ethanol to form a solution, and the solution is slowly dripped into a DMSO mixed solution and is stirred for 24 h at the room temperature. After stirring, a mixed solution is dripped into excess ethyl acetate, centrifuging is performed to obtain solid particles, the solid particles are dissolved in ethanol again, and 160 ul of normal hexyl amine is added therein to serve as ligands so as to stabilize the nanoparticles. A solution is further immersed into excess ethyl acetate, and after centrifuging, a solid is dissolved in ethanol to form a magnesium zinc oxide (containing 15% of magnesium) solution containing normal hexyl amine ligands, that is, a material of the first sub-function layer 21 is formed.

It needs to be noted that the above method for forming the first sub-function layer 21, the second sub-function layer 22 and the third sub-function layer 23 only exemplarily illustrates a synthesis process of the function layers, some used parameters are parameters adopted by the inventor of the case at that time, of course, the above parameters are not limited to the numeric values of the case and may be selected according to actual needs, which is not limited to the present disclosure. In addition, when other ligands are synthesized, parameters of different substances are also different, and those skilled in the art may make reasonable proportions.

S902, the three function layer materials are mixed to form a mixed solution.

Optionally, the material of the first sub-function layer 21, the material of the second sub-function layer 22 and the material of the third sub-function layer 23 respectively synthesized in step S901 are mixed to form the mixed solution.

S903, spin-coating of the mixed solution is performed by adopting a spin-coating method to form the light emitting function layers.

Figure 10:
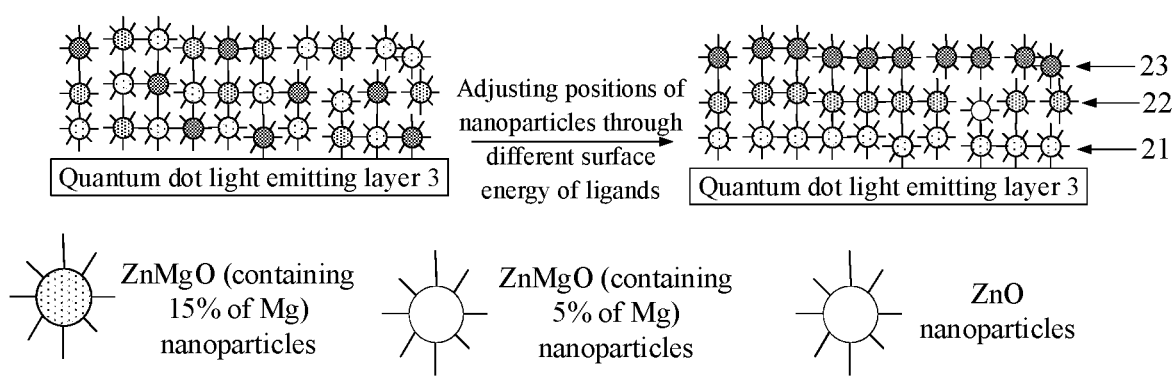
FIG. 10 is a simulation schematic diagram of preparing an electron transfer layer in FIG. 1.

Optionally, the quantum dot light emitting layer 3 in the structure shown in FIG. 1 being CdSe/ZnS quantum dots is taken as an example, wherein quantum dot ligands are dodecanethiol. A base substrate where ITO/Ag/ITO is deposited as the anode 1 is spin-coated with a hole transfer layer material at about 3000 rpm, and annealing is carried out at 250° C. for 30 min to form a hole transfer layer 4. The hole transfer layer 4 is spin-coated with quantum dot materials at about 2500 rpm, and annealing is carried out at 120° C. for 10 min to form the quantum dot light emitting layer 3. The magnesium zinc oxide solution (containing 15% of magnesium) containing the normal hexyl amine ligands, the magnesium zinc oxide nanoparticles (containing 5% of magnesium) containing the ethanol amine ligands and the zinc oxide solution containing the pentafluoropropionamide ligands in step S902 are dissolved in ethanol together to form the mixed solution with the concentration of 20 mg/ml. The quantum dot light emitting layer 3 is spin-coated with the mixed solution through a spin-coating method at a rotating speed of 2500 rpm, standing is carried out for about 60 s, and annealing is carried out at 120° C. for 20 min. As shown in FIG. 10, the surface energy of the ligands corresponding to the third sub-function layer 23, the second sub-function layer 22 and the first sub-function layer 21 is gradually increased, and due to the difference of the surface energy, the third sub-function layer 23 with the lowest surface energy tends to gather on an upper surface of the electron transfer layer 2, the first sub-function layer 21 with the highest surface energy tends to gather on a lower surface of the electron transfer layer 2, and the second sub-function layer 22 with the intermediate surface energy gathers in the middle of the electron transfer layer 2. In this way, three electron transfer materials with different energy levels and correspondingly having three surface energy ligands may be mixed and then form a film through spin-coating, so that the third sub-function layer 23 with the lowest surface energy is closest to the cathode 5, the first sub-function layer 21 with the highest surface energy is closest to the quantum dot light emitting layer 3, and the second sub-function layer 22 with the intermediate surface energy is located between the first sub-function layer 21 and the third sub-function layer 23. Therefore, the LUMO energy level of the electron transfer layer 2 may be matched with the LUMO energy level of the quantum dot light emitting layer 3 so that carrier transmission and balance as well as device efficiency can be improved.

It needs to be noted that some used parameters in the structure shown in FIG. 1 are parameters adopted by the inventor of the case at that time, of course, the above parameters are not limited to the numeric values of the case and may be selected according to actual needs, which is not limited to the present disclosure.

In the preparation method of the quantum dot light emitting device provided by the embodiment of the present disclosure, three materials with different surface energy and energy levels are mixed and then form the first sub-function layer 21, the second sub-function layer 22 and the third sub-function layer 23 through one-time spin-coating, the film layers with gradually-changing energy levels are formed by utilizing the difference of the surface energy, and thus defects between interfaces caused by multi-layer spin-coating film forming may be reduced.

During specific implementation, in the above preparation method provided by an embodiment of the present disclosure, after the electron transfer layer 2 in FIG. 1 is formed, the method further includes forming the cathode to complete preparation of the whole device. A cathode material may be silver with a thickness of about 120 nm.

Figure 11:
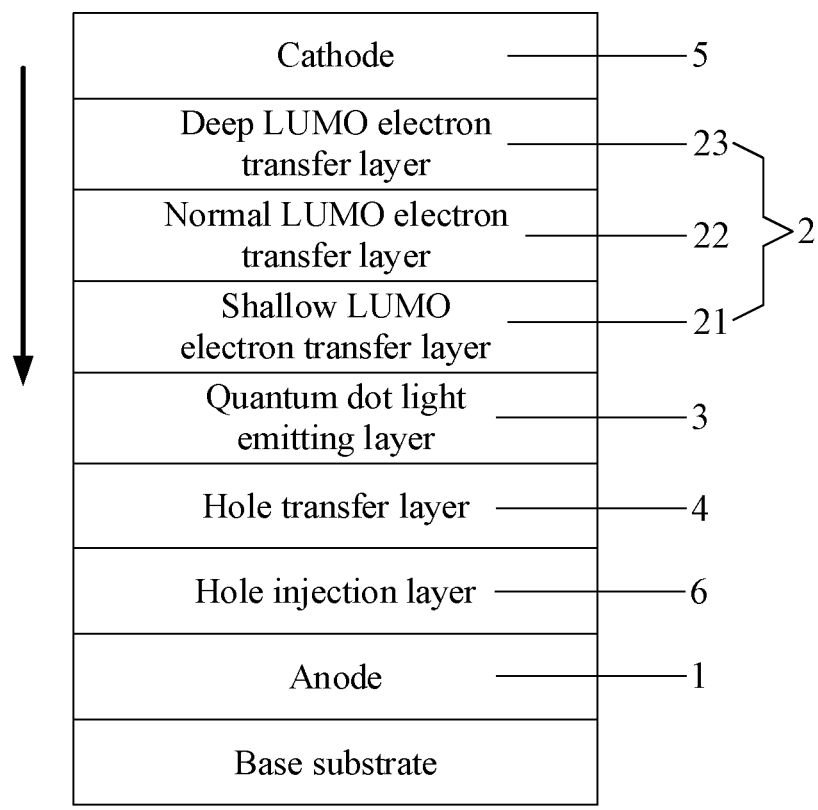
FIG. 11 is a schematic structural diagram corresponding to FIG. 1 and including a hole injection layer.
Figure 12:
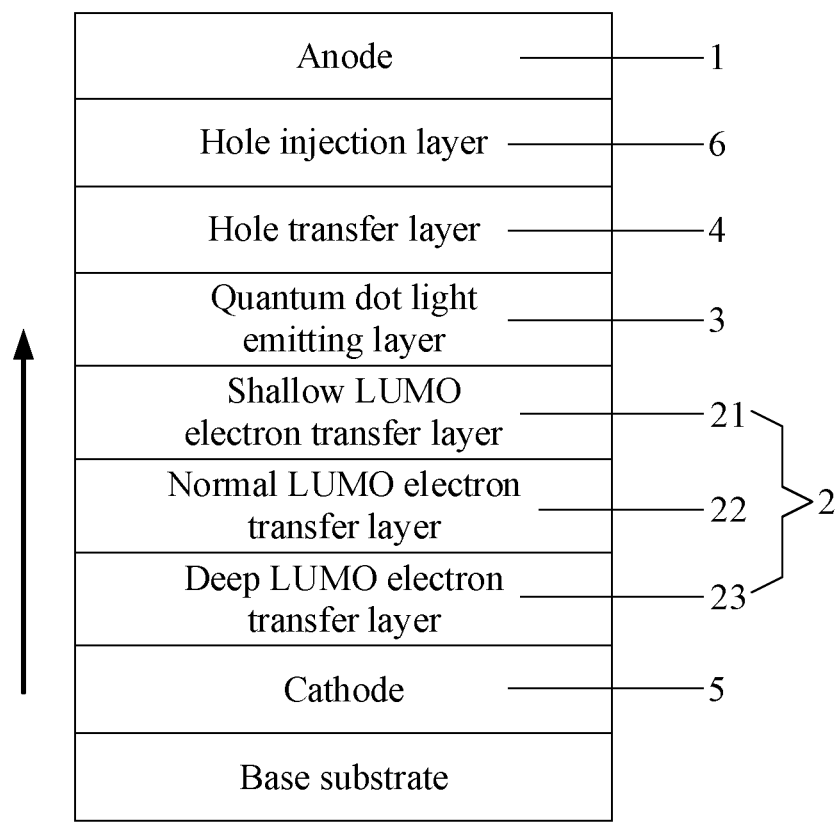
FIG. 12 is a schematic structural diagram corresponding to FIG. 2 and including a hole injection layer.

During specific implementation, in the above preparation method provided by an embodiment of the present disclosure, after the anode 1 in FIG. 1 is formed and before the hole transfer layer 4 is formed, the method may further include forming a hole injection layer 6, as shown in FIG. 11. FIG. 1 shows an upright structure, and when an inverted structure shown in FIG. 2 is adopted, a structure including the hole injection layer 6 is as shown in FIG. 12. Structures shown in FIGS. 3-8 may also include the hole injection layer.

During specific implementation, in the above preparation method provided by an embodiment of the present disclosure, when the hydrophilic film layer is spin-coated with the mixed solution in step S902, the surface energy of the hydrophilic amine ligands is greater than that of the hydrophobic amine ligands. See description of relevant contents in the quantum dot light emitting device for the specific principle.

When the hydrophobic film layer is spin-coated with the mixed solution in step S902, the surface energy of the hydrophobic amine ligands is greater than that of the hydrophilic amine ligands. See description of relevant contents in the quantum dot light emitting device for the specific principle.

Based on the same inventive concept, an embodiment of the present disclosure further provides a display apparatus, including the quantum dot light emitting device in the above embodiment. Since the principle for solving problems of the display apparatus is similar to the aforementioned quantum dot light emitting device, implementation of the display apparatus may refer to implementation of the aforementioned quantum dot light emitting device, and repetitions are omitted herein.

Figure 13:
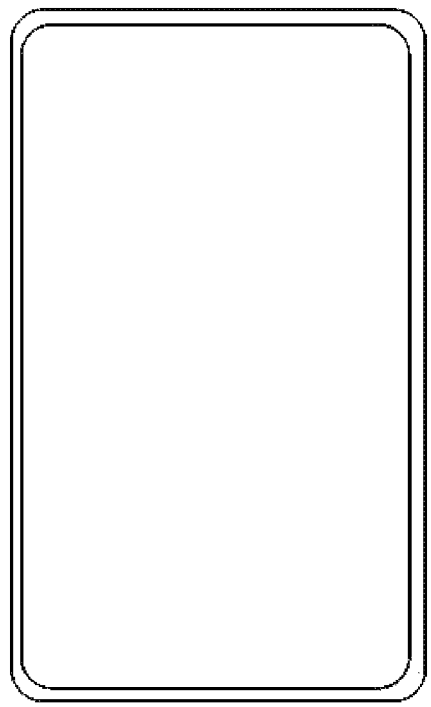
FIG. 13 is a schematic structural diagram of a display apparatus provided by an embodiment of the present disclosure.

During specific implementation, the display apparatus provided by an embodiment of the present disclosure, as shown in FIG. 13, may be: a mobile phone, a tablet computer, a television, a display, a laptop, a digital photo frame, a navigator and any product or component having a display function, which is not limited here.

According to the quantum dot light emitting device, the preparation method thereof and the display apparatus provided by embodiments of the present disclosure, at least one of the one or more light emitting function layers is disposed to include the at least two sub-function layers, each sub-function layer includes the ligands, and the surface energy of the ligands corresponding to the sub-function layers gradiently changes in the transmission direction of the carriers in the sub-function layers, so that the energy levels of the sub-function layers gradiently change; and in this way, the energy levels of the sub-function layers can be matched with the energy levels of the adjacent light emitting function layers so that carrier transmission and balance as well as device efficiency can be improved.

Apparently, those skilled in the art can perform various changes and modifications on the disclosure without departing from the spirit and scope of the disclosure. Therefore, if these changes and modifications on the disclosure fall in the scope of the claims of the disclosure and their equivalent technologies, the disclosure is also intended to contain these changes and modifications.

What is claimed is:

1. A quantum dot light emitting device, comprising an anode, one or more light emitting function layers and a cathode which are disposed in a stacked mode, wherein at least one of the one or more light emitting function layers comprises at least two sub-function layers, each of the sub-function layers comprises ligands, and surface energy of the ligands corresponding to the each of the sub-function layers gradiently changes in a transmission direction of carriers in the each of the sub-function layers, so that energy levels of the sub-function layers gradiently change;

wherein the at least one of the one or more light emitting function layers comprises three sub-function layers;

wherein the ligands comprise: fluorine-containing group ligands with low surface energy as well as hydrophobic amine ligands and hydrophilic amine ligands with high surface energy;

wherein in response to the light emitting function layers being manufactured on a hydrophilic film layer, the surface energy of the hydrophilic amine ligands is greater than that of the hydrophobic amine ligands; and in response to the light emitting function layers being manufactured on a hydrophobic film layer, the surface energy of the hydrophobic amine ligands is greater than that of the hydrophilic amine ligands.

2. The quantum dot light emitting device according to claim 1, wherein the hydrophilic amine ligands comprise alcohol amine ligands, and the hydrophobic amine ligands comprise alkane amine ligands.

3. The quantum dot light emitting device according to claim 2, wherein the light emitting function layers comprise an electron transfer layer, a quantum dot light emitting layer and a hole transfer layer, the electron transfer layer is close to the cathode, and the hole transfer layer is close to the anode; wherein at least one of the electron transfer layer, the quantum dot light emitting layer or the hole transfer layer comprises three sub-function layers.

4. The quantum dot light emitting device according to claim 3, wherein the electron transfer layer comprises a first sub-function layer, a second sub-function layer and a third sub-function layer which are disposed in a stacked mode, the first sub-function layer is close to the quantum dot light emitting layer, and the third sub-function layer is close to the cathode; and LUMO energy levels of the first sub-function layer, the second sub-function layer and the third sub-function layer are gradually deepened, and surface energy of the first sub-function layer, the second sub-function layer and the third sub-function layer is gradually decreased or gradually increased.

5. The quantum dot light emitting device according to claim 4, wherein in response to the electron transfer layer being manufactured on the hydrophobic film layer, a material of the first sub-function layer is magnesium zinc oxide nanoparticles with hydrophobic amine as ligands, and molar mass of magnesium is 0% to 50% that of magnesium zinc oxide; a material of the second sub-function layer is magnesium zinc oxide nanoparticles with hydrophilic amine as ligands, and molar mass of magnesium is 0% to 50% that of magnesium zinc oxide; and a material of the third sub-function layer is zinc oxide nanoparticles with fluorine-containing groups as ligands, and content of the magnesium in the first sub-function layer is greater than content of the magnesium in the second sub-function layer; and in response to the electron transfer layer being manufactured on the hydrophilic film layer, a material of the first sub-function layer is magnesium zinc oxide nanoparticles with fluorine-containing groups as ligands, and molar mass of magnesium is 0% to 50% that of magnesium zinc oxide; a material of the second sub-function layer is magnesium zinc oxide nanoparticles with hydrophobic amine as ligands, and molar mass of magnesium is 0% to 50% that of magnesium zinc oxide; and a material of the third sub-function layer is zinc oxide nanoparticles with hydrophilic amine as ligands, and content of the magnesium in the first sub-function layer is greater than content of the magnesium in the second sub-function layer.

6. The quantum dot light emitting device according to claim 3, wherein the quantum dot light emitting layer comprises a fourth sub-function layer, a fifth sub-function layer and a sixth sub-function layer which are disposed in a stacked mode, the fourth sub-function layer is close to the hole transfer layer, and the sixth sub-function layer is close to the electron transfer layer; and HOMO energy levels of the fourth sub-function layer, the fifth sub-function layer and the sixth sub-function layer are gradually deepened, and surface energy of the fourth sub-function layer, the fifth sub-function layer and the sixth sub-function layer is gradually decreased or gradually increased.

7. The quantum dot light emitting device according to claim 6, wherein ligands of the fourth sub-function layer comprise triphenylamine or carbazole ligands, ligands of the fifth sub-function layer comprise alkane ligands, and ligands of the sixth sub-function layer comprise pyridine ligands;

in response to the quantum dot light emitting layer being manufactured on a hydrophobic film layer, the ligands of the fourth sub-function layer further comprise hydrophobic amine ligands, the ligands of the fifth sub-function layer further comprise hydrophilic amine ligand, and the ligands of the sixth sub-function layer further comprise fluorine-containing group ligands; and in response to the quantum dot light emitting layer being manufactured on a hydrophilic film layer, the ligands of the fourth sub-function layer further comprise fluorine-containing group ligands, the ligands of the fifth sub-function layer further comprise hydrophobic amine ligand, and the ligands of the sixth sub-function layer further comprise hydrophilic amine ligands.

8. The quantum dot light emitting device according to claim 3, wherein the quantum dot light emitting layer comprises a fourth sub-function layer, a fifth sub-function layer and a sixth sub-function layer which are disposed in a stacked mode, the fourth sub-function layer is close to the hole transfer layer, and the sixth sub-function layer is close to the electron transfer layer; and LUMO energy levels of the fourth sub-function layer, the fifth sub-function layer and the sixth sub-function layer are gradually deepened, and surface energy of the fourth sub-function layer, the fifth sub-function layer and the sixth sub-function layer is gradually decreased or gradually increased.

9. The quantum dot light emitting device according to claim 8, wherein in response to the quantum dot light emitting layer being manufactured on a hydrophobic film layer, ligands of the fourth sub-function layer have hydrophobic amine ligands, ligands of the fifth sub-function layer comprise hydrophilic amine ligand, and ligands of the sixth sub-function layer comprise fluorine-containing group ligands; and in response to that the quantum dot light emitting layer being manufactured on a hydrophilic film layer, the ligands of the fourth sub-function layer further comprise fluorine-containing group ligands, the ligands of the fifth sub-function layer further comprise hydrophobic amine ligand, and the ligands of the sixth sub-function layer comprise hydrophilic amine ligands.

10. The quantum dot light emitting device according to claim 3, wherein the hole transfer layer comprises a seventh sub-function layer, an eighth sub-function layer and a ninth sub-function layer which are disposed in a stacked mode, the seventh sub-function layer is close to the anode, and the ninth sub-function layer is close to the quantum dot light emitting layer; and HOMO energy levels of the seventh sub-function layer, the eighth sub-function layer and the ninth sub-function layer are gradually deepened, and surface energy of the seventh sub-function layer, the eighth sub-function layer and the ninth sub-function layer is gradually decreased or gradually increased.

11. The quantum dot light emitting device according to claim 10, wherein in response to the hole transfer layer being manufactured on a hydrophilic film layer, a material of the seventh sub-function layer is nickel oxide nanoparticles with hydrophilic amine as ligands; a material of the eighth sub-function layer is nickel cesium oxide nanoparticles with hydrophobic amine as ligands, and molar mass of cesium is 0% to 50% that of nickel cesium oxide; and a material of the ninth sub-function layer is nickel cesium oxide nanoparticles with fluorine-containing groups as ligands, molar mass of cesium is 0% to 50% that of nickel cesium oxide, and content of the cesium in the ninth sub-function layer is greater than content of the cesium in the eighth sub-function layer; and in response to the hole transfer layer being manufactured on a hydrophobic film layer, a material of the seventh sub-function layer is nickel oxide nanoparticles with fluorine-containing groups as ligands; a material of the eighth sub-function layer is nickel cesium oxide nanoparticles with hydrophilic amine as ligands, and molar mass of cesium is 0% to 50% that of nickel cesium oxide; and a material of the ninth sub-function layer is nickel cesium oxide nanoparticles with hydrophobic amine as ligands, molar mass of cesium is 0% to 50% that of nickel cesium oxide, and content of the cesium in the ninth sub-function layer is greater than content of the cesium in the eighth sub-function layer.

12. A display apparatus, comprising the quantum dot light emitting device according to claim 1.

\* \* \* \* \*